(12) United States Patent
Fukuda et al.

(10) Patent No.: US 9,181,400 B2
(45) Date of Patent: Nov. 10, 2015

(54) SILICONE RESIN COMPOSITION, CURED SILICONE RESIN, AND SEALED OPTICAL SEMICONDUCTOR ELEMENT

(71) Applicant: SUMITOMO SEIKA CHEMICALS CO., LTD., Hyogo (JP)

(72) Inventors: Noriaki Fukuda, Hyogo (JP); Shohei Sanada, Hyogo (JP); Katsumasa Yamamoto, Hyogo (JP)

(73) Assignee: Sumitomo Seika Chemicals Co., Ltd., Hyogo (JP)

( * ) Notice: Subject to any disclaimer, the term of this patent is extended or adjusted under 35 U.S.C. 154(b) by 0 days.

(21) Appl. No.: 14/438,499

(22) PCT Filed: Oct. 16, 2013

(86) PCT No.: PCT/JP2013/078057
§ 371 (c)(1),
(2) Date: Apr. 24, 2015

(87) PCT Pub. No.: WO2014/073341
PCT Pub. Date: May 15, 2014

(65) Prior Publication Data
US 2015/0284515 A1    Oct. 8, 2015

(30) Foreign Application Priority Data

Nov. 9, 2012    (JP) .................................. 2012-247611
Mar. 12, 2013   (JP) .................................. 2013-049435

(51) Int. Cl.
| | | |
|---|---|---|
| H01L 29/08 | (2006.01) | |
| H01L 35/24 | (2006.01) | |
| H01L 51/00 | (2006.01) | |
| C08G 77/26 | (2006.01) | |
| H01L 33/56 | (2010.01) | |

(52) U.S. Cl.
CPC ................ *C08G 77/26* (2013.01); *H01L 33/56* (2013.01); *C08G 2190/00* (2013.01)

(58) Field of Classification Search
USPC ......................................................... 257/40
See application file for complete search history.

(56) References Cited

U.S. PATENT DOCUMENTS

| | | |
|---|---|---|
| 2006/0122323 A1 | 6/2006 | Dumont et al. |
| 2009/0258058 A1 | 10/2009 | Thomas et al. |
| 2011/0227235 A1 | 9/2011 | Yoshitake et al. |

FOREIGN PATENT DOCUMENTS

| | | |
|---|---|---|
| CN | 1382183 | 11/2002 |
| CN | 1671916 | 9/2005 |
| CN | 101478973 | 7/2009 |
| CN | 101885851 | 11/2010 |
| CN | 102131874 | 7/2011 |
| CN | 102190890 | 9/2011 |
| CN | 102234431 | 11/2011 |
| CN | 102627859 | 8/2012 |
| JP | 2005-158762 | 6/2005 |
| JP | 2005-158764 | 6/2005 |
| JP | 2006-137797 | 6/2006 |
| JP | 2009-173789 | 8/2009 |
| JP | 2010-084118 | 4/2010 |
| JP | 2011-012144 | 1/2011 |
| JP | 2011-178983 | 9/2011 |
| JP | 2011-246693 | 12/2011 |
| JP | 2012-012434 | 1/2012 |
| JP | 2012-149131 | 8/2012 |
| WO | 01/32766 | 5/2001 |
| WO | 2012/108609 | 8/2012 |

*Primary Examiner* — Errol Fernandes

(74) *Attorney, Agent, or Firm* — Hamre, Schumann, Mueller & Larson, P.C.

(57) ABSTRACT

The present invention provides a silicone resin composition having excellent adhesion. The present invention also aims to provide a cured silicone resin and a sealed optical semiconductor element each produced using the silicone resin composition. The present invention relates to a silicon resin composition comprising: a silicon resin mixture; and (B) a silicon compound, the silicon resin mixture containing (A-i) polyorganosiloxane that has at least two substituents each having a carbon-carbon double bond bonded to a silicon atom, (A-ii) polyorganohydrogen siloxane having at least two hydrogen groups each bonded to a silicon atom, and (A-iii) a hydrosilylation catalyst, the (B) silicone compound having a structural unit represented by Formula (1-3) and a structural unit represented by Formula (1-4) between a structural unit represented by Formula (1-1) and a structural unit represented by Formula (1-2):

[Chem. 1]

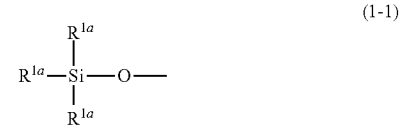

(1-1)

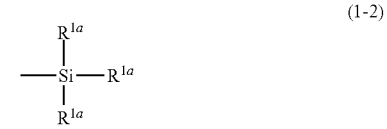

(1-2)

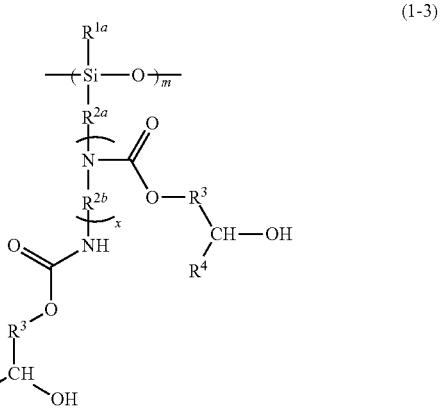

(1-3)

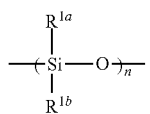

(1-4)

in Formula (1-1) and Formula (1-2), $R^{1a}$s each independently representing a C1-C18 hydrocarbon group selected from an alkyl group, a cycloalkyl group, an aryl group, and an aralkyl group, in Formula (1-3) and Formula (1-4), $R^{1b}$s each independently representing a C1-C18 hydrocarbon group selected from an alkyl group, a cycloalkyl group, an aryl group, and an aralkyl group, in Formula (1-3), $R^{2a}$ representing a C1-C8 alkylene group in which a part of carbon atoms, except for the carbon atom bonded to a silicon atom, is optionally substituted with an oxygen atom, $R^{2b}$ representing a C1-C3 alkylene group, $R^3$ representing a C1-C3 alkylene group, $R^4$ representing a hydrogen atom, a C1-C3 alkyl group, a C1-C3 alkyl group having an OH group, or a halogeno group, in Formula (1-3), m representing an integer of 1 to 50, x representing an integer of 0 to 2, and in Formula (1-4), n representing an integer of 10 to 1500.

6 Claims, No Drawings

SILICONE RESIN COMPOSITION, CURED SILICONE RESIN, AND SEALED OPTICAL SEMICONDUCTOR ELEMENT

TECHNICAL FIELD

The present invention relates to a silicone resin composition having excellent adhesion and storage stability. The present invention also relates to a cured silicone resin and a sealed optical semiconductor element each produced using the silicone resin composition.

BACKGROUND ART

In LEDs and optical semiconductor devices, a transparent resin is commonly used as a sealing material of a light emitting element. Examples of the transparent resin include epoxy resins and silicone resins of the addition curing type, condensation curing type, and UV curing type. Silicone resins are particularly used for sealing high-luminance and high-output optical semiconductor elements (e.g., white LED) because they form cured products having excellent properties such as weather resistance and heat resistance. The silicone resins however have poor adhesion to noble metals (e.g., silver) which are used as semiconductor materials. Moreover, the silicone resins also have poor adhesion to polyphthalamide resin (PPA), which is a reflector material. Depending on heat radiation from the light emitting element and the temperature cycle, the adhesion further lowers to problematically cause separation between a base material (e.g., PPA) or a noble metal electrode and the silicone resin.

To solve such problems, adhesion-imparting agents such as various silane coupling agents are added to improve the adhesion. The effect thereof is, however, not sufficient. Moreover, such a composition disadvantageously has its adhesion lowered due to very high moisture absorption, leading to poor durability.

Patent Literature 1 discloses an addition-curable silicone resin composition containing an isocyanuric ester having an epoxy group as an adhesion-imparting agent. Patent Literature 2 discloses, as an adhesive silicone resin, a reactive modified silicone resin containing vinyl and carbamate groups in the same molecule and having an alkoxy or OH group bonded to a silicon atom at one molecular end.

However, a means of adding an isocyanuric ester as disclosed in Patent Literature 1 does not give a sufficient effect of improving the adhesion to a base material.

A modified silicone resin as disclosed in Patent Literature 2 includes a vinyl group that provides curability and a carbamate group that provides adhesion in the same molecule. In this case, carbamate groups may be uniformly dispersed in the entire cured resin and the concentration thereof around the adhesion interface may lower, possibly resulting in an insufficient effect of improving the adhesion. Moreover, if the amount of carbamate groups in molecules is increased to increase the concentration of carbamate groups around the adhesion interface, physical properties or durability of the silicon resin may be adversely affected.

In addition, a silicone resin containing an alkoxy or OH group bonded to a silicon atom problematically has poor storage stability.

CITATION LIST

Patent Literature

Patent Literature 1: JP-A 2006-137797
Patent Literature 2: WO 2012/108609

SUMMARY OF INVENTION

Technical Problem

The present invention aims to provide a silicone resin composition having excellent adhesion and storage stability. The present invention also aims to provide a cured silicone resin and a sealed optical semiconductor element each produced using the silicone resin composition.

Solution to Problem

The present invention relates to a silicon resin composition comprising: a silicon resin mixture; and (B) a silicon compound, the silicon resin mixture containing (A-i) polyorganosiloxane that has at least two substituents each having a carbon-carbon double bond bonded to a silicon atom, (A-ii) polyorganohydrogen siloxane having at least two hydrogen groups each bonded to a silicon atom, and (A-iii) a hydrosilylation catalyst, the (B) silicone compound having a structural unit represented by Formula (1-3) and a structural unit represented by Formula (1-4) between a structural unit represented by Formula (1-1) and a structural unit represented by Formula (1-2).

[Chem. 1]

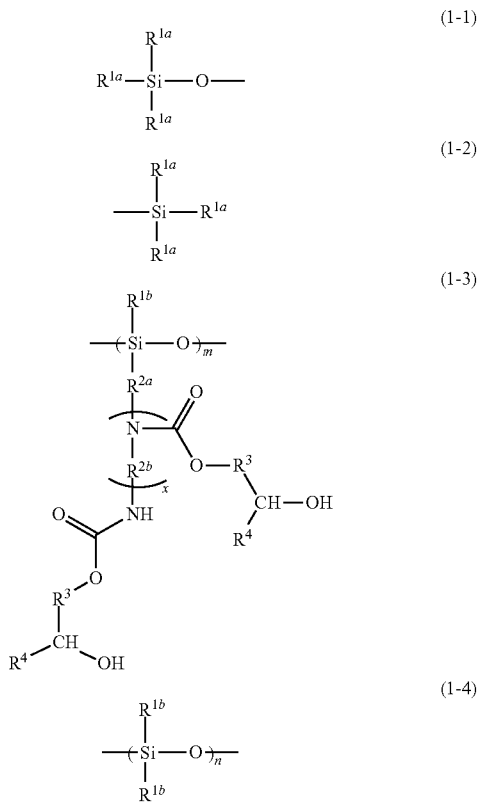

In Formula (1-1) and Formula (1-2), $R^{1a}$s each independently represent a C1-C18 hydrocarbon group selected from an alkyl group, a cycloalkyl group, an aryl group, and an aralkyl group. In Formula (1-3) and Formula (1-4), $R^{1b}$s each independently represent a C1-C18 hydrocarbon group selected from an alkyl group, a cycloalkyl group, an aryl group, and an aralkyl group. In Formula (1-3), $R^{2a}$ represents a C1-C8 alkylene group in which a part of carbon atoms, except for the carbon atom bonded to a silicon atom, is optionally substituted with an oxygen atom, $R^{2b}$ represents a C1-C3 alkylene group, and $R^3$ represents a C1-C3 alkylene group, $R^4$ represents a hydrogen atom, a C1-C3 alkyl group, a C1-C3 alkyl group having an OH group, or a halogeno group. In Formula (1-3), m represents an integer of 1 to 50, x represents an integer of 0 to 2, and in Formula (1-4), n represents an integer of 10 to 1500.

The present invention is specifically described in the following.

The present inventors found that the use of a silicone compound having a specific structure as an adhesion-imparting agent enables preparation of a silicone resin composition having significantly excellent adhesion and storage stability, thereby completing the present invention.

The silicone resin composition of the present invention comprises a silicone resin mixture.

The silicone resin mixture contains polyorganosiloxane (hereafter, also referred to as component (A-i)) having at least two substituents each having a carbon-carbon double bond bonded to a silicon atom.

The component (A-i) may have, for example, a linear or cyclic molecular structure, and may have a branch in the structure. Particularly preferred is a linear structure including a main chain that is composed of repeating units of diorganosiloxane and having both ends capped with triorganosiloxy groups.

The substituent having a carbon-carbon double bond bonded to a silicon atom in the component (A-i) preferably has a carbon number of 2 to 8. Specific examples thereof include vinyl, allyl, butenyl, pentenyl, hexenyl, heptenyl, acryloyl, and methacryloyl. In particular, preferred is vinyl, acryloyl, or methacryloyl, and more preferred is vinyl.

When the component (A-i) has a linear molecular structure, the substituents each having a carbon-carbon double bond may be bonded to silicon atoms only at the ends or intermediate parts of the molecular chain, or at both the ends and the intermediate parts of the molecular chain.

Examples of the organic group bonded to a silicon atom other than the substituents each having a carbon-carbon double bond in the component (A-i) include unsubstituted or halogen-substituted monovalent hydrocarbon groups such as C1-C10 alkyl groups (e.g., methyl, ethyl, propyl, butyl, pentyl, hexyl, cyclohexyl, and heptyl), C6-C14 aryl groups (e.g., phenyl, tolyl, xylyl, and naphthyl), aralkyl groups (e.g., benzyl and phenethyl), and halogenated alkyl groups (e.g., chloromethyl, 3-chloropropyl, and 3,3,3-trifluoro propyl). Particularly preferred examples are methyl and phenyl.

The component (A-i) has a viscosity of preferably 100 to 100000 mPa·s. When the component (A-i) has a viscosity within this range, the resulting silicone resin composition has favorable workability and a cured product thereof has favorable physical properties. The component (A-i) has a viscosity of more preferably 500 to 10000 mPa·s.

The "viscosity" as used herein refers to a value measured with a rotational viscometer (BM type) under the condition of 25° C.

Specific examples of the component (A-i) include dimethylsiloxane-methylvinylsiloxane copolymers having both molecular chain ends capped with trimethylsiloxy groups, methylvinylpolysiloxane having both molecular chain ends capped with trimethylsiloxy groups, dimethylsiloxane-methylvinylsiloxane-methylphenylsiloxane copolymers having both molecular chain ends capped with trimethylsiloxy groups, dimethylpolysiloxane having both molecular chain ends capped with dimethylvinylsiloxy groups, methylvinylpolysiloxane having both molecular chain ends capped with dimethylvinylsiloxy groups, dimethylsiloxane-methylvinylsiloxane copolymers having both molecular chain ends capped with dimethylvinylsiloxy groups, dimethylsiloxane-methylvinylsiloxane-methylphenylsiloxane copolymers having both molecular chain ends capped with dimethylvinylsiloxy groups, dimethylpolysiloxane having both molecular chain ends capped with trivinylsiloxy groups; polyorganosiloxane copolymers comprising a siloxy unit represented by $(R^5)_3SiO_{0.5}$ ($R^5$ represents a unsubstituted or substituted monovalent hydrocarbon group other than alkenyl group, and the same shall apply hereafter), a siloxy unit represented by $(R^5)_2R^6SiO_{0.5}$ ($R^6$ represents an alkenyl group, and the same shall apply hereafter), a siloxy unit represented by $(R^5)_2SiO$, and a siloxy unit represented by $SiO_2$; polyorganosiloxane copolymers comprising a siloxy unit represented by $(R^5)_3SiO_{0.5}$, a siloxy unit represented by $(R^5)_2R^6SiO_{0.5}$, and a siloxy unit represented by $SiO_2$; polyorganosiloxane copolymers comprising a siloxy unit represented by $(R^5)_2R^6SiO_{0.5}$, a siloxy unit represented by $(R^5)_2SiO$, and a siloxy unit represented by $SiO_2$; and polyorganosiloxane copolymers comprising a siloxy unit represented by $R^5R^6SiO$ and a siloxy unit represented by $R^5SiO_{1.5}$ or $R^6SiO_{1.5}$. Each of these may be used alone, or two or more of these may be used in combination.

Examples of the $R^5$ include alkyl groups such as methyl, ethyl, propyl, butyl, pentyl, hexyl, and heptyl; aryl groups such as phenyl, tolyl, xylyl, and naphthyl; aralkyl groups such as benzyl and phenethyl; and halogenated alkyl groups such as chloromethyl, 3-chloropropyl, and 3,3,3-trifluoropropyl.

Examples of the $R^6$ include vinyl, allyl, butenyl, pentenyl, hexenyl, heptenyl, acryloyl, and methacryloyl.

The silicone resin mixture contains polyorganohydrogen siloxane (hereafter, also referred to as component (A-ii)) having at least two hydrogen groups bonded to silicon atoms. The component (A-ii) reacts with the component (A-i) to serve as a crosslinking component.

The structure of the polyorganohydrogen siloxanes as the component (A-ii) can be linear, cyclic, branched, three-dimensional network (resinous).

The component (A-ii) has at least two, preferably at least three hydrogen atoms bonded to silicon atoms, namely, hydrosilyl groups (Si—H groups), in a molecule. When the component (A-ii) has a linear molecular structure, Si—H groups thereof may be positioned at the ends or intermediate parts of the molecular chain, or at both the end and the intermediate part of the molecular chain.

The number (polymerization degree) of silicon atoms in a molecule of the component (A-ii) is preferably 2 to 1000 and more preferably 3 to 100.

The component (A-ii) is polyorganohydrogen siloxane represented by $R^7_aH_bSiO_{(4-a-b/2)}$ (wherein $R^7$ represents a unsubstituted or substituted C1-C14 monovalent hydrocarbon group other than aliphatic unsaturated groups, $R^7$ preferably has a carbon number of 1 to 10; a and b are preferably positive numbers satisfying $0.7 \leq a \leq 2.1$ and $0.001 \leq b \leq 1.0$, respectively, and also satisfying $0.8 \leq a+b \leq 3.0$, and more preferably satisfying $1.0 \leq a+b \leq 2.5$).

Examples of the $R^7$ include alkyl groups such as methyl, ethyl, propyl, isopropyl, butyl, isobutyl, t-butyl, pentyl, neopentyl, hexyl, cyclohexyl, octyl, nonyl, and decyl; aryl groups such as phenyl, tolyl, xylyl, and naphthyl; aralkyl groups such as benzyl, phenyl ethyl, and phenyl propyl; and groups obtainable by substituting a part or all of hydrogen atoms in the hydrocarbon group as mentioned above with halogen atoms, such as chloromethyl, 3-chloropropyl, bromoethyl, and 3,3,3-trifluoropropyl. The $R^7$ is preferably an alkyl or aryl group, and is more preferably methyl or phenyl.

Specific examples of the component (A-ii) include methylhydrogenpolysiloxane having both molecular chain ends capped with trimethylsiloxy groups, dimethylsiloxane-methylhydrogensiloxane copolymers having both molecular chain ends capped with trimethylsiloxy groups, dimethylsiloxane-methylhydrogensiloxane-methylphenylsiloxane copolymers having both molecular chain ends capped with trimethylsiloxy groups, dimethylpolysiloxane having both molecular chain ends capped with dimethylhydrogensiloxy groups, dimethyl polysiloxane-methylhydrogensiloxane copolymers having both molecular chain ends capped with dimethylhydrogensiloxy groups, dimethylsiloxane-methylphenylsiloxane copolymers having both molecular chain ends capped with dimethylhydrogensiloxy groups, methylphenylpolysiloxane having both molecular chain ends capped with dimethylhydrogensiloxy groups; polyorganosiloxane copolymers comprising a siloxy unit represented by $(R^5)_3SiO_{0.5}$ ($R^5$ is as defined above), a siloxy unit represented by $(R^5)_2HSiO_{0.5}$, and a siloxy unit represented by $SiO_2$; polyorganosiloxane copolymers comprising a siloxy unit represented by $(R^5)_2HSiO_{0.5}$ and a siloxy unit represented by $SiO_2$; and polyorganosiloxane copolymers comprising a siloxy unit represented by $R^5HSiO$ and a siloxy unit represented by $R^5SiO_{1.5}$ or $HSiO_{1.5}$. Each of these may be used alone, or two or more of these may be used in combination.

The amount of polyorganohydrogen siloxane as the component (A-ii) is equal to the effective amount for curing of the component (A-i) and preferably satisfies a ratio of 0.1 to 4.0 Si—H groups in the component (A-ii) for each substituent having a carbon-carbon double bond in the component (A-i). If the number of Si—H groups is less than 0.1 for each substituent having a carbon-carbon double bond, the curing reaction may not proceed, possibly leading to difficulty in preparing a cured product. If the number of Si—H groups is more than 4.0 for each substituent having a carbon-carbon double bond, a large number of unreacted Si—H groups are left in the cured product, which may cause a change in physical properties of the cured product with time. The number of Si—H groups is more preferably 1.0 to 3.0 for each substituent having a carbon-carbon double bond.

The silicone resin mixture contains a hydrosilylation catalyst (hereafter, also referred to as component (A-iii)).

The component (A-iii) may be a conventionally known compound. Specific examples thereof include: platinum group metal catalysts and the like. The platinum group metal catalysts include: platinum group metal simple substances such as platinum (including platinum black), rhodium, and palladium; platinum chloride, chloroplatinic acid, and chloroplatinate (e.g., $H_2PtCl_4 \cdot nH_2O$, $H_2PtCl_6 \cdot nH_2O$, $NaHPtCl_6 \cdot nH_2O$, $KHPtCl_6 \cdot nH_2O$, $Na_2PtCl_6 \cdot nH_2O$, $K_2PtCl_4 \cdot nH_2O$, $PtCl_4 \cdot nH_2O$, $PtCl_2$, $Na_2HPtCl_4 \cdot nH_2O$ (in the formulae, n represents an integer of 0 to 6 and preferably 0 or 6)); alcohol-modified chloroplatinic acid (see U.S. Pat. No. 3,220,972); complexes of chloroplatinic acid and olefin (see U.S. Pat. No. 3,159,601, U.S. Pat. No. 3,159,662, U.S. Pat. No. 3,775,452); those obtainable by supporting a platinum group metal (e.g., platinum black, palladium) on a carrier (e.g., alumina, silica, carbon); rhodium-olefin complexes; chlorotris(triphenyl phosphine) rhodium (Wilkinson's catalyst); complexes of vinyl group-containing siloxane and platinum chloride, chloroplatinic acid, or chloroplatinate; dichloro dipyridine platinum (II) (see JP-A 09-165453); and vinyl siloxane complexes of platinum (e.g., $Pt_2\{[(CH_2\!=\!CH) Me_2Si]_2O\}_3$, $HPt_2\{[(CH_2\!=\!CH) Me_2Si_2]O\}_2$, $PtCO(CH_2\!=\!CH(Me)SiO)_4$, $Pt(CH_2\!=\!CH(Me)SiO)_4)$ (see JP-A 11-152337).

The amount of the component (A-iii) is not particularly limited as long as the component (A-iii) in such an amount effectively serves as a catalyst in hydrosilylation. The amount is preferably 0.1 to 1000 ppm in terms of metallic elements, such as platinum, relative to the total of the components (A-i), (A-ii), and (A-iii). When the amount of the hydrosilylation catalyst is within this range, the addition reaction is sufficiently promoted, so that the resulting silicone resin composition can be sufficiently cured. In addition, the use of the hydrosilylation catalyst in such an amount is economically advantageous. The amount of the hydrosilylation catalyst is more preferably 1 to 500 ppm, and still more preferably 1 to 20 ppm.

Exemplary commercial products of the silicone resin mixture include XE14-C2860, XE14-C3450, IVS5854, IVS4312, XE14-C2042, IVS4542, IVS4546, IVS4622, IVS4632, IVS4742, IVS4752 (all produced by Momentive Performance Materials Inc.), ASP-1111, ASP-1031, ASP-1120, SCR-1012, SCR-1016, KER-6110, KER-2500, KER-2500N, KER-2600, KER-2700, KER-6000, KER-6150, KER-6200, KER-6075, KER-6020, KER-3000, KER-3010, KER-3100, KER-3200, KE-109, KE-1031, KE-106 (all produced by Shin-Etsu Chemical Co., Ltd.), OE-6351, OE-6336, EG-6301, OE-6520, OE-6550, OE-6631, OE-6636, OE-6635, OE-6630, OE-6665N, JCR-6125, and JCR-6140 (all produced by Dow Corning Toray Co., Ltd.).

The silicone resin composition of the present invention contains a silicone compound (hereafter, also referred to as a component (B)) having a structural unit represented by Formula (1-3) and a structural unit represented by Formula (1-4) between a structural unit represented by Formula (1-1) and a structural unit represented by Formula (1-2). The structural units represented by Formula (1-1) and Formula (1-2) each refer to a molecular end. The component (B) may be a block copolymer or random copolymer. The component (B) serves as an adhesion-imparting agent and the use thereof only in a small amount sufficiently exerts its effect. The reason for this is presumably that the component (B) not containing a curable functional group such as vinyl groups in its molecular structure is gradually segregated on the adhesion interface during the curing reaction of the silicone resin composition to increase the concentration thereof at the adhesion interface. Since the component (B) does not contain an alkoxy or OH group bonded to a silicon atom in its molecular structure, the component (B) has excellent storage stability.

In Formula (1-1) and Formula (1-2), $R^{1a}$s each individually represent a C1-C18 hydrocarbon group selected from an alkyl group, a cycloalkyl group, an aryl group, and an aralkyl group. The phrase "each individually" as used herein means "they may be the same as or different from each other".

Examples of a C1-C18 alkyl group represented by $R^{1a}$ include methyl, ethyl, n-propyl, isopropyl, n-butyl, isobutyl, tert-butyl, n-pentyl, neopentyl, tert-pentyl, hexyl, n-heptyl, 2,2,4-trimethylpentyl, octyl, isooctyl, n-nonyl, n-decyl, and n-dodecyl.

Examples of a C1-C18 cycloalkyl group represented by $R^{1a}$ include cyclopentyl, cyclohexyl, cycloheptyl, and methylcyclohexyl.

Examples of a C1-C18 aryl group represented by $R^{1a}$ include phenyl, naphthyl, o-tolyl, m-tolyl, p-tolyl, xylyl, and ethyl phenyl.

Examples of a C1-C18 aralkyl group represented by $R^{1a}$ include benzyl, α-phenylethyl, and ρ-phenylethyl.

In particular, $R^{1a}$ is preferably a C1-C18 alkyl or aryl group, and more preferably methyl or phenyl.

In Formula (1-3) and Formula (1-4), $R^{1b}$s each independently represent a C1-C18 hydrocarbon group such as an alkyl group, a cycloalkyl group, an aryl group, and an aralkyl group.

Examples of a C1-C18 alkyl group represented by $R^{1b}$ include methyl, ethyl, n-propyl, isopropyl, n-butyl, isobutyl, tert-butyl, n-pentyl, neopentyl, tert-pentyl, hexyl, n-heptyl, 2,2,4-trimethylpentyl, octyl, isooctyl, n-nonyl, n-decyl, and n-dodecyl.

Examples of a C1-C18 cycloalkyl group represented by $R^{1b}$ include cyclopentyl, cyclohexyl, cycloheptyl, and methylcyclohexyl.

Examples of a C1-C18 aryl group represented by $R^{1b}$ include phenyl, naphthyl, o-tolyl, m-tolyl, p-tolyl, xylyl, and ethyl phenyl.

Examples of a C1-C18 aralkyl group represented by $R^{1b}$ include benzyl, α-phenylethyl, and ρ-phenylethyl.

In particular, $R^{1b}$ is preferably a C1-C18 alkyl or aryl group, and more preferably methyl or phenyl.

In Formula (1-3), $R^{2a}$ represents a C1-C8 alkylene group in which a part of carbon atoms, except for the carbon atom bonded to a silicon atom, are optionally substituted with oxygen atoms.

Examples of $R^{2a}$ include methylene, ethylene, propylene, butylene, pentylene, octylene, and groups obtainable by substituting a part of carbon atoms of these alkylene groups with oxygen atoms.

In formula (1-3), $R^{2b}$ represents a C1-C3 alkylene group.

Examples of $R^{2b}$ include methylene, ethylene, and propylene.

In Formula (1-3), $R^3$ represents a C1-C3 alkylene group.

Examples of $R^3$ include methylene, ethylene, and propylene.

In Formula (1-3), $R^4$ represents a hydrogen atom, a C1-C3 alkyl group, a C1-C3 alkyl group having an OH group, or a halogeno group.

Examples of a C1-C3 alkyl group represented by $R^4$ include methyl, ethyl, n-propyl, and i-propyl. Examples of a C1-C3 alkyl group having an OH group represented by $R^4$ include methylol and ethylol.

In Formula (1-3), m represents an integer of 1 to 50, and preferably 2 to 45. In Formula (1-4), n represents an integer of 10 to 1500, and preferably 20 to 1400.

In Formula (1-3), x represents an integer of 0 to 2.

Here, the case of X being 0 refers to a case where $R^{2a}$ and the NH group are directly bonded to each other.

As the component (B), one compound may be used alone, or two or more compounds may be used in combination.

From the standpoint of availability of raw materials, in Formula (1-3) in the component (B), preferably, $R^3$ represents methylene, $R^4$ represents a hydrogen atom, and x represents 0 or 1.

The Formula (1-3) functional group equivalent of the component (B) is preferably 300 at the minimum and 15000 at the maximum. The Formula (1-3) functional group equivalent of the component (B) is more preferably 500 at the minimum and 12000 at the maximum. The Formula (1-3) functional group equivalent of the component (B) is still more preferably 1000 at the minimum and 10000 at the maximum.

In an exemplary method for producing the component (B), a silicone compound (hereafter, also referred to as a silicone compound having an amino group) having a structural unit represented by Formula (2-3) and a structural unit represented by Formula (2-4) between a structural unit represented by Formula (2-1) and a structural unit represented by Formula (2-2) is reacted with a cyclic carbonate compound represented by Formula (3) (hereafter, also simply referred to as a cyclic carbonate compound).

[Chem. 2]

(2-1)

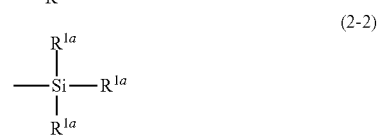

(2-2)

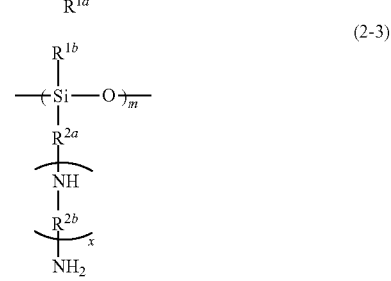

(2-3)

(2-4)

In Formula (2-1) and Formula (2-2), $R^{1a}$s each independently represent a C1-C18 hydrocarbon group selected from an alkyl group, a cycloalkyl group, an aryl group, and an aralkyl group. In Formula (2-3) and Formula (2-4), $R^{1b}$s each independently represent a C1-C18 hydrocarbon group selected from an alkyl group, a cycloalkyl group, an aryl group, and an aralkyl group. In Formula (2-3), $R^{2a}$ represents a C1-C8 alkylene group in which a part of carbon atoms, except for the carbon atom bonded to a silicon atom, are optionally substituted with oxygen atoms, and $R^{2b}$ represents a C1-C3 alkylene group. In Formula (2-3), m represents an integer of 1 to 50 and x represents an integer of 0 to 2. In Formula (2-4), n represents an integer of 10 to 1500.

[Chem. 3]

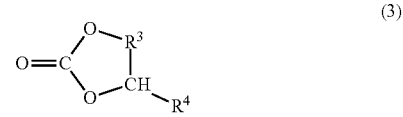

(3)

In Formula (3), $R^3$ represents a C1-C3 alkylene group and $R^4$ represents a hydrogen atom, a C1-C3 alkyl group, a C1-C3 alkyl group having an OH group, or a halogeno group.

The method for producing a silicone compound having an amino group may be a method including polycondensation reaction by which a dialkoxyalkylsilane unit having an alkylamino group is inserted into a siloxane chain, as disclosed in U.S. Pat. No. 3,355,424, U.S. Pat. No. 2,947,771, U.S. Pat. No. 3,890,269, and the like. This reaction is commonly carried out in the presence of an acidic or alkaline catalyst. This reaction may also be carried out as polymerization reaction using dialkoxyalkylsilane and cyclic siloxane.

Exemplary commercial products of the silicone compound having an amino group include KF-864, KF-865, KF-868 (monoamine-type), KF-859, KF-393, KF-860, KF-880, KF-8004, KF-8002, KF-8005, KF-867, X-22-3820W, KF-869, KF-861 (diamine-type) (all produced by Shin-Etsu Chemical Co., Ltd.), BY16-205, BY16-849, FZ-3785, BY16-872, and BY16-213 (all produced by Dow Corning Toray Co., Ltd.).

Examples of the cyclic carbonate compound include a compound represented by Formula (4). In particular, from the standpoint of easiness of the reaction and performance, preferred are compounds of Formula (3) wherein $R^3$ represents methylene, and more preferred are ethylene carbonate and glycerol carbonate.

[Chem. 4]

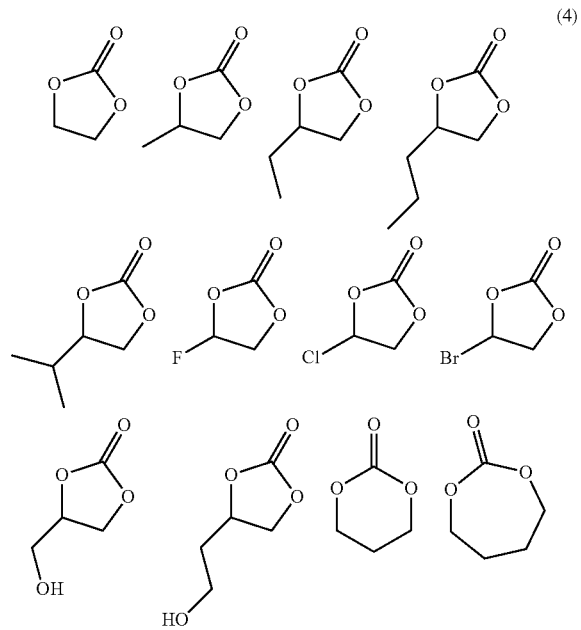

(4)

The amount of the cyclic carbonate compound in the reaction between the silicone compound having an amino group and the cyclic carbonate compound is preferably 0.5 to 10 mol and more preferably 0.8 to 5 mol per mole of amino group in the silicone compound having an amino group.

The amino group herein refers to an amino group reactive with the cyclic carbonate compound. Specific examples thereof include primary amino groups and secondary amino groups.

The reaction between the silicone compound having an amino group and the cyclic carbonate compound may be carried out in the presence of a solvent. The solvent is preferably a solvent easily dissolving the silicone compound having an amino group and having appropriate polarity, and examples thereof include benzene, toluene, xylene, chlorobenzene, dichlorobenzene, cyclohexane, dichloromethane, chloroform, diethyl ether, diisopropylether, acetone, ethyl methyl ketone, methyl isobutyl ketone, isopropanol, and butanol.

The reaction between the silicone compound having an amino group and the cyclic carbonate compound is preferably carried out at a temperature within a range of 40 to 180° C. according to the solvent used, and is more preferably carried out at a temperature within a range of 80 to 160° C. without using a solvent.

The amount of the component (B) is preferably 0.01 to 20 parts by mass relative to 100 parts by mass of the total of the components (A-i), (A-ii), and (A-iii). If the amount of the component (B) is less than 0.01 parts by mass, the effect of improving the adhesion may not be sufficiently exerted. If the amount of the component (B) is more than 20 parts by mass, the hardness of the cured product may be adversely affected. The amount of the component (B) is more preferably 0.1 to 10 parts by mass and still more preferably 0.5 to 5 parts by mass.

The amount of the component (B) is preferably 0.01 to 15% by mass relative to the whole silicone resin composition of the present invention. If the amount of the component (B) is less than 0.01% by mass, the effect of improving the adhesion may not be sufficiently exerted. If the amount of the component (B) is more than 15% by mass, the hardness of the cured product may be adversely affected. The amount of the component (B) is more preferably 0.1 to 10% by mass and still more preferably 0.5 to 5% by mass.

The silicone resin composition of the present invention may optionally contain, in addition to the components (A-i), (A-ii), and (A-iii) and the component (B), additives in such a range as not to impair the aim or effect of the present invention.

Examples of the additives include inorganic fillers, antioxidants, inorganic fluorescent materials, lubricants, ultraviolet absorbers, heat/light stabilizers, dispersants, antistatic agents, polymerization inhibitors, defoamers, curing accelerators, solvents, age resistors, radical inhibitors, adhesion improvers, flame retardants, surfactants, storage stability improvers, ozone age resistors, thickeners, plasticizers, radiation blocking agents, nucleating agents, coupling agents, conductivity imparting agents, phosphorus peroxide decomposers, pigments, metal deactivators, and physical property modifiers.

The inorganic fillers are not particularly limited, and examples thereof include those in the form of fine particles not lowering the optical properties. Specific examples thereof include alumina, aluminum hydroxide, fused silica, crystalline silica, ultra-fine amorphous silica powder, ultra-fine hydrophobic silica powder, talc, calcium carbonate, and barium sulfate.

Examples of the inorganic fluorescent materials include yttrium-aluminum-garnet (YAG) fluorescent materials, ZnS fluorescent materials, $Y_2O_2S$ fluorescent materials, red light-emitting fluorescent materials, blue light-emitting fluorescent materials, and green light-emitting fluorescent materials, which are widely used for LEDs.

In an exemplary method for producing the silicone resin composition of the present invention, a silicone resin mixture containing the components (A-i), (A-ii), and (A-iii) is mixed with the component (B) and additives to be used according to needs.

The silicone resin composition of the present invention may be one-pack type or two-pack type.

If the components (A-i), (A-ii), and (A-iii) and the component (B) are stored in the form of a mixture, polymerization may proceed during the storage. Industrially preferably, the composition is stored as a two-pack type composition including, for example, a liquid containing the components (A-i), (A-iii), and (B) and a liquid containing the component (A-ii), and the liquids are mixed before use. In the present invention, storage of the component (A-i) and the component (B) in the form of a mixture does not adversely affect the quality. In this regards too, the component (B) is more useful than conventional adhesion-imparting agents.

The silicone resin composition of the present invention is used, for example, by being applied to a base material such as an optical semiconductor element and cured.

Examples of the method of applying the silicone resin composition of the present invention to a base material include application using a dispenser, potting, screen printing, transfer molding, and injection molding.

The silicone resin composition of the present invention can be cured at room temperature or by heating. A cured silicone resin obtained by curing the silicone resin composition of the present invention is also encompassed by the present invention.

The final heating temperature upon curing of the silicone resin composition of the present invention by heating is commonly 100° C. or higher, preferably 120° C. or higher, more preferably 120 to 200° C., and still more preferably 120 to 180° C.

Examples of the usage of the silicone resin composition of the present invention include sealing agent compositions for electronic materials, sealing agent compositions for buildings, sealing agent compositions for automobiles, and adhesive compositions.

Examples of the electronic materials include support members such as lead frames, wired tape carriers, wiring boards, glass, and silicon wafers; optical semiconductor elements; active elements such as semiconductor chips, transistors, diodes, and thyristors; and passive elements such as capacitors, resistors, and coils. In particular, the silicone resin composition of the present invention can be suitably used as a sealing agent for optical semiconductor elements. A sealed optical semiconductor element sealed in the cured silicone resin of the present invention is also encompassed by the present invention.

The silicone resin composition of the present invention is also usable for, for example, display materials, optical recording medium materials, optical equipment materials, optical component materials, optical fiber materials, organic materials for electronics and photonics, and peripheral materials for semiconductor integrated circuits.

Advantageous Effects of Invention

The present invention can provide a silicone resin composition having excellent adhesion and storage stability. The present invention also can provide a cured silicone resin and a sealed optical semiconductor element each produced using the silicone resin composition.

DESCRIPTION OF EMBODIMENTS

The present invention is described in more detail with reference to, but not limited to, examples in the following.

Production Example 1

(Reaction (B-1a) between silicone compound having amino group and ethylene carbonate)

A 50-mL four-neck flask equipped with a stirrer, a thermometer, and a condenser was charged with 10.0 g (amino group content of 2.63 mmol) of a silicone compound having an amino group (product of Shin-Etsu Chemical Co., Ltd., "KF-864", amino group equivalent of 3800 g/mol) and 0.46 g (5.26 mmol) of ethylene carbonate (molecular weight of 88.06) in nitrogen atmosphere. The contents were heated to 120° C. and then stirred for 12 hours. The amount of residual amino groups was confirmed to be less than 1% by neutralization titration. The mixture was blended with 50 g of chlorobenzene and 50 g of water, and subjected to liquid separation. The resulting organic phase was concentrated to give 9.2 g of a transparent liquid (B-1a).

By $^1$H-NMR measurement, the liquid (B-1a) was confirmed to have structural units represented by Formulae (1-1) and (1-2) ($R^{1a}$ represents methyl), a structural unit represented by Formula (1-3) ($R^{1b}$ represents methyl, $R^{2a}$ represents propylene, $R^3$ represents methylene, $R^4$ represents hydrogen, x represents 0), and a structural unit represented by Formula (1-4) ($R^{1b}$ represents methyl).

Production Example 2

(Reaction (B-1b) between silicone compound having amino group and glycerol carbonate)

A 50-mL four-neck flask equipped with a stirrer, a thermometer, and a condenser was charged with 10.0 g (amino group content of 2.63 mmol) of a silicone compound having an amino group (product of Shin-Etsu Chemical Co., Ltd., "KF-864", amino group equivalent of 3800 g/mol) and 0.47 g (3.95 mmol) of glycerolcarbonate (molecular weight of 118.09) in nitrogen atmosphere. The contents were heated to 120° C. and then stirred for 12 hours. The amount of residual amino groups was determined to be less than 1% by neutralization titration. The mixture was blended with 50 g of chlorobenzene and 50 g of water, and subjected to liquid separation. The resulting organic phase was concentrated to give 8.8 g of a transparent liquid (B-1b).

By $^1$H-NMR measurement, the liquid (B-1b) was confirmed to have structural units represented by Formulae (1-1) and (1-2) ($R^{1a}$ represents methyl), a structural unit represented by Formula (1-3) ($R^{1b}$ represents methyl, $R^{2a}$ represents propylene, $R^3$ represents methylene, $R^4$ represents hydroxy methyl, x represents 0), and a structural unit represented by Formula (1-4) ($R^{1b}$ represents methyl).

Production Example 3

(Reaction (B-1c) between silicone compound having amino group and trimethylene carbonate)

A 50-mL four-neck flask equipped with a stirrer, a thermometer, and a condenser was charged with 10.0 g (amino group content of 2.63 mmol) of a silicone compound having an amino group (product of Shin-Etsu Chemical Co., Ltd., "KF-864", amino group equivalent of 3800 g/mol) and 0.94 g (9.21 mmol) of trimethylene carbonate (molecular weight of 102.09) in nitrogen atmosphere. The contents were heated to 120° C. and then stirred for 20 hours. The amount of residual amino groups was confirmed to be less than 1% by neutralization titration. Then, the mixture was blended with 50 g of chlorobenzene and 50 g of water, and subjected to liquid separation. The resulting organic phase was concentrated to give 8.8 g of a transparent liquid (B-1c).

By $^1$H-NMR measurement, the liquid (B-1c) was confirmed to have structural units represented by Formulae (1-1) and (1-2) ($R^{1a}$ represents methyl), a structural unit represented by Formula (1-3) ($R^{1b}$ represents methyl, $R^{2a}$ represents propylene, $R^3$ represents ethylene, $R^4$ represents a hydrogen atom, x represents 0), and a structural unit represented by Formula (1-4) ($R^{1b}$ represents methyl).

Production Example 4

(Reaction (B-2a) between silicone compound having amino group and ethylene carbonate)

A 50-mL four-neck flask equipped with a stirrer, a thermometer, and a condenser was charged with 10.0 g (amino group content of 2.00 mmol) of a silicone compound having an amino group (product of Shin-Etsu Chemical Co., Ltd., "KF-865", amino group equivalent of 5000 g/mol) and 0.35 g (4.00 mmol) of ethylene carbonate (molecular weight of 88.06) in nitrogen atmosphere. The contents were heated to 120° C. and then stirred for 15 hours. The amount of residual amino groups was confirmed to be less than 1% by neutralization titration. The mixture was blended with 50 g of chlorobenzene and 50 g of water, and subjected to liquid separation. The resulting organic phase was concentrated to give 9.3 g of a transparent liquid (B-2a).

By $^1$H-NMR measurement, the liquid (B-2a) was confirmed to have structural units represented by Formulae (1-1) and (1-2) ($R^{1a}$ represents methyl), a structural unit represented by Formula (1-3) ($R^{1b}$ represents methyl, $R^{2a}$ represents propylene, $R^3$ represents methylene, $R^4$ represents a hydrogen atom, x represents 0), and a structural unit represented by Formula (1-4) ($R^{1b}$ represents methyl).

Production Example 5

(Reaction (B-3a) between silicone compound having amino group and ethylene carbonate)

A 50-mL four-neck flask equipped with a stirrer, a thermometer, and a condenser was charged with 10.0 g (amino group content of 1.14 mmol) of a silicone resin having an amino group (product of Shin-Etsu Chemical Co., Ltd., "KF-868", amino group equivalent of 8800 g/mol) and 0.40 g (4.56 mmol) of ethylene carbonate (molecular weight of 88.06) in nitrogen atmosphere. The contents were heated to 120° C. and then stirred for 20 hours. The amount of residual amino groups was confirmed to be less than 1% by neutralization titration. Then, the mixture was blended with 50 g of chlorobenzene and 50 g of water, and subjected to liquid separation. The resulting organic phase was concentrated to give 9.3 g of a transparent liquid (B-3a).

By $^1$H-NMR measurement, the liquid (B-3a) was confirmed to have structural units represented by Formulae (1-1) and (1-2) ($R^{1a}$ represents methyl), a structural unit represented by Formula (1-3) ($R^{1b}$ represents methyl, $R^{2a}$ represents propylene, $R^3$ represents methylene, $R^4$ represents a hydrogen atom, x represents 0), a structural unit represented by Formula (1-4) ($R^{1b}$ represents methyl).

Production Example 6

(Reaction (B-4a) between silicone compound having amino group and ethylene carbonate)

A 50-mL four-neck flask equipped with a stirrer, a thermometer, and a condenser was charged with 10.0 g (amino group content of 3.33 mmol) of a silicone resin having an amino group (product of Shin-Etsu Chemical Co., Ltd., "KF-859", amino group equivalent of 3000 g/mol) and 1.47 g (16.7 mmol) of ethylene carbonate (molecular weight of 88.06) in nitrogen atmosphere. The contents were heated to 120° C. and then stirred for 24 hours. The amount of residual amino groups was confirmed to be less than 1% by neutralization titration. The mixture was blended with 50 g of chlorobenzene and 50 g of water, and subjected to liquid separation. The resulting organic phase was concentrated to give 9.0 g of a transparent liquid (B-4a).

By $^1$H-NMR measurement, the liquid (B-4a) was confirmed to have structural units represented by Formulae (1-1) and (1-2) ($R^{1a}$ represents methyl), a structural unit represented by Formula (1-3) ($R^{1b}$ represents methyl, $R^{2a}$ represents propylene, $R^{2b}$ represents ethylene, $R^3$ represents methylene, $R^4$ represents a hydrogen atom, x represents 1), and a structural unit represented by Formula (1-4) ($R^{1b}$ represents methyl).

Examples 1 to 9, Comparative Examples 1 to 3

Components each in an amount as shown in Table 1 were uniformly mixed and then sufficiently deaerated, thereby providing a silicone resin composition.

The silicone resin mixture in Table 1 was a liquid (hereafter, also referred to as "silicone resin mixture-1") obtainable by mixing liquid A and liquid B of IVS-4752 (product of Momentive Performance Materials Inc.) at a ratio of 1:1. The silicone resin mixture-1 mainly contains the components (A-i), (A-ii), and (A-iii).

The component (C-1) in Table 1 was glycidoxypropyltrimethoxysilane (product of Dow Corning Toray Co., Ltd., "Z-6040"). The component (C-2) in Table 1 was triglycidyl isocyanurate (product of Tokyo Chemical Industry Co., Ltd.).

<Evaluation>

The silicone resin compositions obtained in Examples 1 to 9 and Comparative Examples 1 to 3 were subjected to following evaluation. Table 1 shows the results.

(1) Hardness (Type A)

The silicone resin compositions obtained in Examples 1 to 9 and Comparative Examples 1 to 3 were individually poured into a resin mold, and heated at 150° C. for one hour and then at 170° C. for one hour to be cured. The resulting cured products were each released from the mold to give a cured product having a size of a radius of 20 mm×a thickness of 6 mm as a test sample for hardness measurement. The resulting test samples for hardness measurement were measured for the hardness (type A) using a rubber plastic hardness tester (product of KORI SEIKI MFG. CO., LTD., "KR-24A").

(2) Tensile Shear Bond Strength Against Polyphthalamide Resin

The silicone resin compositions obtained in Examples 1 to 9 and Comparative Examples 1 to 3 were individually applied to one of two polyphthalamide resin sheets (size: 2×25×100 mm) in such a manner that an adhesion part has a rectangular shape (12.5×25 mm) and the other polyphthalamide resin sheet was attached thereto. The resulting laminates were heated at 150° C. for one hour and then at 170° C. for one hour, so that the silicone resin compositions were cured to give test samples for tensile shear test. The polyphthalamide resin sheets used as adhesion base materials were preliminary subjected to drying at 150° C. for one hour. The resulting adhered test samples were measured for the tensile shear bond strength using a tensile tester (product of Shimadzu Corporation, "AGS-X") under the conditions of the distance between clamps of 100 mm and the test speed of 5 mm/min. The adhesion strength of Comparative Example 1 in which no adhesion-imparting agent was used was set as the evaluation standard. The case where the adhesion strength was less than 1.1 times the adhesion strength of Comparative Example 1 was evaluated as "Poor (x)". The case where the adhesion strength was 1.1 times or more but less than 1.2 times the adhesion strength of Comparative Example 1 was evaluated as "average (Δ)". The case where the adhesion strength was 1.2 times or more but less than 1.3 times the adhesion strength of Comparative Example 1 was evaluated as "Good (O)". The case where the adhesion strength was 1.3 times or more the adhesion strength of Comparative Example 1 was evaluated as "Excellent (OO)".

TABLE 1

|  |  |  |  | Example 1 | Example 2 | Example 3 | Example 4 | Example 5 | Example 6 | Example 7 | Example 8 | Example 9 | Comparative Example 1 | Comparative Example 2 | Comparative Example 3 |
|---|---|---|---|---|---|---|---|---|---|---|---|---|---|---|---|
| Composition (parts by mass) |  | Silicone resin composition-1 |  | 100 | 100 | 100 | 100 | 100 | 100 | 100 | 100 | 100 | 100 | 100 | 100 |
|  | Adhesion-imparting agent | Component (B) | (B-1a) | 0.1 | 1 | 3 | 5 | — | — | — | — | — | — | — | — |
|  |  |  | (B-1b) | — | — | — | — | 1 | — | — | — | — | — | — | — |
|  |  |  | (B-1c) | — | — | — | — | — | 1 | — | — | — | — | — | — |
|  |  |  | (B-2a) | — | — | — | — | — | — | 1 | — | — | — | — | — |
|  |  |  | (B-3a) | — | — | — | — | — | — | — | 1 | — | — | — | — |
|  |  |  | (B-4a) | — | — | — | — | — | — | — | — | 1 | — | — | — |
|  |  | Others | Glycidoxypropyltrimethoxysilane (C-1) | — | — | — | — | — | — | — | — | — | — | 1 | — |
|  |  |  | Triglycidyl isocyanurate (C-2) | — | — | — | — | — | — | — | — | — | — | — | 1 |
| Evaluation |  | Hardness (type A) |  | 72 | 71 | 70 | 70 | 72 | 71 | 70 | 72 | 71 | 72 | 70 | 70 |
|  |  | Tensile shear bond strength against polyphthalamide resin |  | ○ | ○○ | ○○ | ○○ | ○○ | ○ | ○○ | ○○ | ○○ | — | x | Δ |

Table 1 shows that use of the component (B) enhances the adhesion to polyphthalamide resin. In particular, the silicone resin compositions of Examples 2 to 4 wherein the amount of the component (B) was within the range of 1 to 5 parts by mass exhibited more excellent adhesion. In contrast, the silicon resin compositions of Comparative Example 2 wherein the silane coupling agent (C-1), which is commonly used for enhancing the adhesion, was used and Comparative Example 3 wherein triglycidyl isocyanurate (C-2) was used only exhibited insufficient adhesion.

Examples 10 to 18, Comparative Examples 4 to 6

Components each in an amount as shown in Table 2 were uniformly mixed and then sufficiently deaerated, thereby providing a silicone resin composition.

The silicone resin mixture (hereafter, referred to as a silicone resin mixture-2) in Table 2 was liquid A of IVS-4752 (product of Momentive Performance Materials Inc.). The silicone resin mixture-2 mainly contains the component (A-i).

The component (C-1) in Table 1 was glycidoxypropyltrimethoxysilane (product of Dow Corning Toray Co., Ltd., "Z-6040") and the component (C-2) was triglycidyl isocyanurate (product of Tokyo Chemical Industry Co., Ltd.).

<Evaluation>

The silicone resin compositions obtained in Examples 10 to 18 and Comparative Examples 4 to 6 were subjected to following evaluation. Table 2 shows the results.

(3) Storage Stability

The silicone resin compositions obtained in Examples 10 to 18 and Comparative Examples 4 to 6 were warmed at 70° C. for 30 days. The viscosity (23° C.) and the transmittance (wavelength of 400 nm) thereof before and after the warming were measured. Based on the variation before and after the warming, the storage stability was evaluated. The viscosity was measured using a digital viscometer "DVH-EII" (product of TOKIMEC INC.). The transmittance was measured using a U-4100 spectrophotometer (product of Hitachi High-Technologies Corporation).

TABLE 2

|  |  |  |  | Example 10 | Example 11 | Example 12 | Example 13 | Example 14 | Example 15 | Example 16 | Example 17 | Example 18 | Comparative Example 4 | Comparative Example 5 | Comparative Example 6 |
|---|---|---|---|---|---|---|---|---|---|---|---|---|---|---|---|
| Composition (parts by mass) |  | Silicone resin composition-2 |  | 100 | 100 | 100 | 100 | 100 | 100 | 100 | 100 | 100 | 100 | 100 | 100 |
|  | Adhesion-imparting agent | Component (B) | (B-1a) | 0.1 | 1 | 3 | 5 | — | — | — | — | — | — | — | — |
|  |  |  | (B-1b) | — | — | — | — | 1 | — | — | — | — | — | — | — |
|  |  |  | (B-1c) | — | — | — | — | — | 1 | — | — | — | — | — | — |
|  |  |  | (B-2a) | — | — | — | — | — | — | 1 | — | — | — | — | — |
|  |  |  | (B-3a) | — | — | — | — | — | — | — | 1 | — | — | — | — |
|  |  |  | (B-4a) | — | — | — | — | — | — | — | — | 1 | — | — | — |
|  |  | Others | Glycidoxypropyltrimethoxysilane (C-1) | — | — | — | — | — | — | — | — | — | — | 1 | — |
|  |  |  | Triglycidyl isocyanurate (C-2) | — | — | — | — | — | — | — | — | — | — | — | 1 |

TABLE 2-continued

|  |  |  | Example 10 | Example 11 | Example 12 | Example 13 | Example 14 | Example 15 | Example 16 | Example 17 | Example 18 | Comparative Example 4 | Comparative Example 5 | Comparative Example 6 |
|---|---|---|---|---|---|---|---|---|---|---|---|---|---|---|
| Evaluation | Storage stability | Variation in viscosity (Pa·s) | Less than 0.1 | Less than 0.1 | Less than 0.1 | Less than 0.1 | Less than 0.1 | Less than 0.1 | Less than 0.1 | Less than 0.1 | Less than 0.1 | Less than 0.1 | 0.5 | Less than 0.1 |
|  |  | Variation in transmittance (%) | Less than 0.5 | Less than 0.5 | Less than 0.5 | Less than 0.5 | Less than 0.5 | Less than 0.5 | Less than 0.5 | Less than 0.5 | Less than 0.5 | Less than 0.5 | 1.2 | Less than 0.5 |

Table 2 shows that the component (B) does not adversely affect the storage stability of the silicone resin compositions. In contrast, the use of the silane coupling agent (C-1), which is commonly used for improving the adhesion, lowered the storage stability.

INDUSTRIAL APPLICABILITY

The present invention provides a silicone resin composition having excellent adhesion. The present invention also provides a cured silicone resin and a sealed optical semiconductor element each produced using the silicone resin composition.

The invention claimed is:

1. A silicon resin composition comprising:
    a silicon resin mixture; and
    (B) a silicon compound,
    the silicon resin mixture containing (A-i) polyorganosiloxane that has at least two substituents each having a carbon-carbon double bond bonded to a silicon atom, (A-ii) polyorganohydrogen siloxane having at least two hydrogen groups each bonded to a silicon atom, and (A-iii) a hydrosilylation catalyst,
    the (B) silicone compound having a structural unit represented by Formula (1-3) and a structural unit represented by Formula (1-4) between a structural unit represented by Formula (1-1) and a structural unit represented by Formula (1-2):

[Chem. 1]

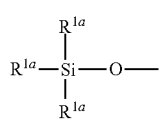
(1-1)

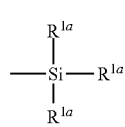
(1-2)

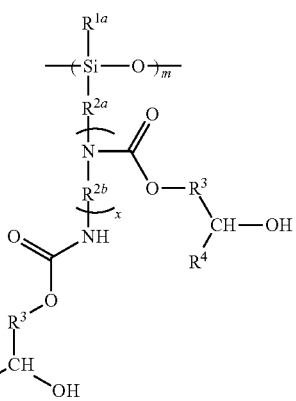
(1-3)

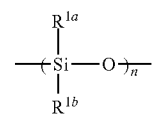
(1-4)

in Formula (1-1) and Formula (1-2), $R^{1a}$s each independently representing a C1-C18 hydrocarbon group selected from an alkyl group, a cycloalkyl group, an aryl group, and an aralkyl group, in Formula (1-3) and Formula (1-4), $R^{1b}$s each independently representing a C1-C18 hydrocarbon group selected from an alkyl group, a cycloalkyl group, an aryl group, and an aralkyl group, in Formula (1-3), $R^{2a}$ representing a C1-C8 alkylene group in which a part of carbon atoms, except for the carbon atom bonded to a silicon atom, is optionally substituted with an oxygen atom, $R^{2b}$ representing a C1-C3 alkylene group, $R^3$ representing a C1-C3 alkylene group, $R^4$ representing a hydrogen atom, a C1-C3 alkyl group, a C1-C3 alkyl group having an OH group, or a halogeno group, in Formula (1-3), m representing an integer of 1 to 50, x representing an integer of 0 to 2, and in Formula (1-4), n representing an integer of 10 to 1500.

2. The silicone resin composition according to claim 1, wherein the substituents each having a carbon-carbon double bond bonded to a silicon atom in the component (A-i) are independently vinyl, acryloyl, or methacryloyl.

3. The silicone resin composition according to claim 1, wherein $R^3$ represents methylene, $R^4$ represents a hydrogen atom, and x represents 0 or 1 in Formula (1-3).

4. The silicone resin composition according to claim 1, wherein the amount of the component (B) is 0.01 to 20 parts by mass based on 100 parts by mass of the total of the components (A-i), (A-ii), and (A-iii).

5. A cured silicone resin obtainable by curing the silicone resin composition according to claim 1.

6. A sealed optical semiconductor element comprising an optical semiconductor element sealed in the cured silicone resin according to claim 5.

* * * * *

UNITED STATES PATENT AND TRADEMARK OFFICE
CERTIFICATE OF CORRECTION

| | | |
|---|---|---|
| PATENT NO. | : 9,181,400 B2 | Page 1 of 1 |
| APPLICATION NO. | : 14/438499 | |
| DATED | : November 10, 2015 | |
| INVENTOR(S) | : Fukuda et al. | |

It is certified that error appears in the above-identified patent and that said Letters Patent is hereby corrected as shown below:

ON THE TITLE PAGE

Abstract, in the formula [Chem. 1] (1-3): delete "$R^{1a}$" and insert --$R^{1b}$--.

Abstract, Page 2, in the formula (1-4): delete "$R^{1a}$" and insert --$R^{1b}$--.

IN THE CLAIMS

Column 18, line 17 in the formula (1-3): delete "$R^{1a}$" and insert --$R^{1b}$--.

Column 18, line 32 in the formula (1-4): delete "$R^{1a}$" and insert --$R^{1b}$--.

Signed and Sealed this
Twenty-ninth Day of March, 2016

Michelle K. Lee
*Director of the United States Patent and Trademark Office*